United States Patent [19]

Dagostino et al.

[11] 4,263,593

[45] Apr. 21, 1981

[54] DISPLAY INTERPOLATOR EMPLOYING A TRANSVERSAL FILTER FOR A DIGITAL OSCILLOSCOPE

[75] Inventors: Thomas P. Dagostino, Beaverton; Bruce E. Miller, Portland; Luis J. Navarro, Beaverton, all of Oreg.

[73] Assignee: Tektronix, Inc., Beaverton, Oreg.

[21] Appl. No.: 68,111

[22] Filed: Aug. 20, 1979

[51] Int. Cl.³ ............................................... G06F 3/14
[52] U.S. Cl. ................................. 340/728; 340/722; 340/747; 364/723; 364/862
[58] Field of Search ...................... 340/722, 728, 747; 364/843, 855, 862, 607, 703, 723

[56] References Cited

U.S. PATENT DOCUMENTS

| 3,984,862 | 10/1976 | Volz | 340/722 |
| 3,996,456 | 12/1976 | Hoover | 364/723 |
| 4,074,281 | 2/1978 | Quarton | 340/747 |
| 4,163,957 | 8/1979 | Knauer et al. | 364/862 |

Primary Examiner—Marshall M. Curtis
Attorney, Agent, or Firm—George T. Noe

[57] ABSTRACT

A display system for a digital oscilloscope includes an interpolator for interpolating between stored waveform samples and providing additional samples at the interpolated values to thereby increase dot density of the resulting display.

4 Claims, 2 Drawing Figures

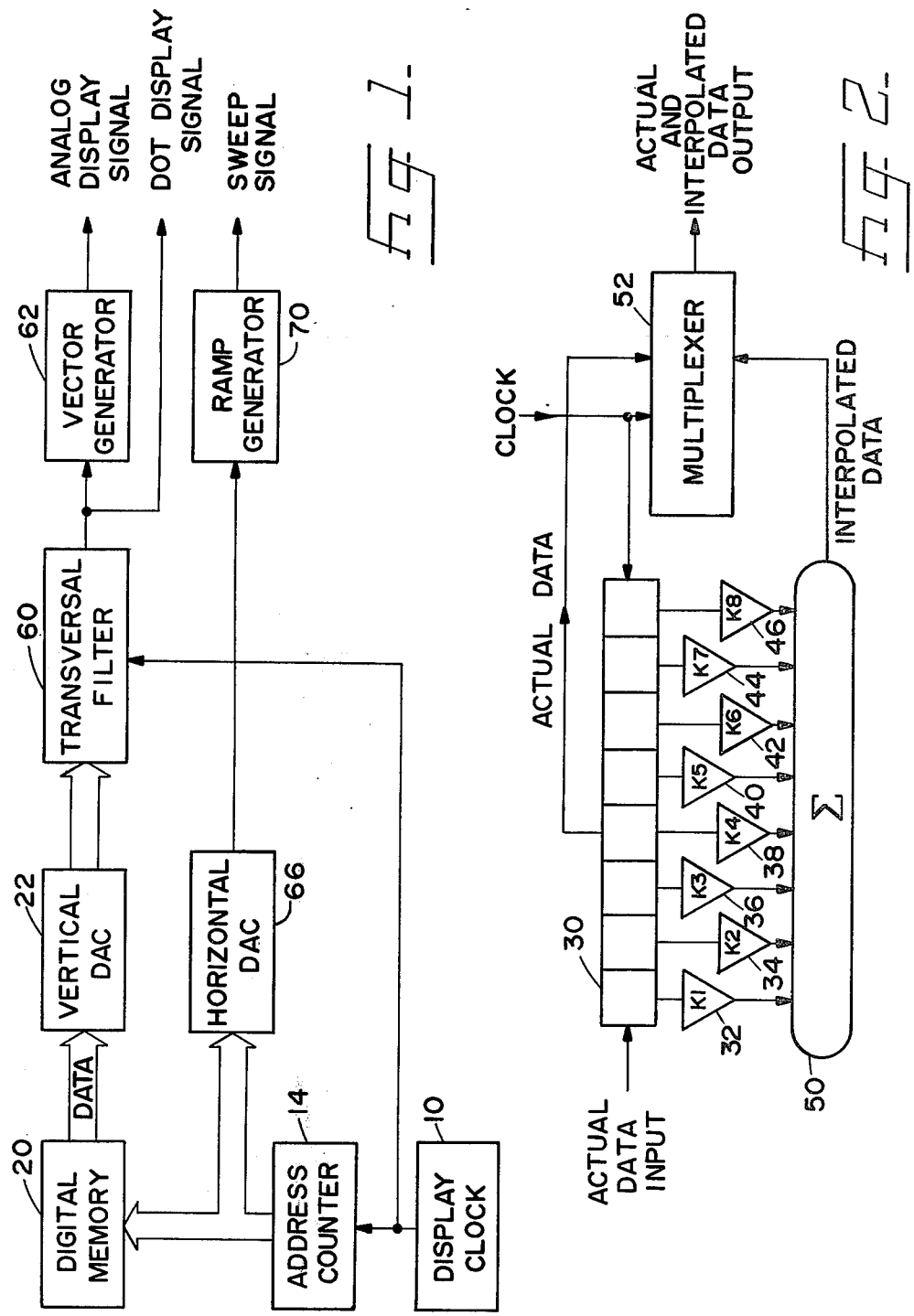

DISPLAY INTERPOLATOR EMPLOYING A TRANSVERSAL FILTER FOR A DIGITAL OSCILLOSCOPE

BACKGROUND OF THE INVENTION

This invention relates to display systems for digital oscilloscopes in general, and in particurlar to a display system including an interpolator for interpolating between stored waveform samples and providing additional samples at the interpolated values.

In prior art digital display systems, only the stored waveform samples are utilized in reconstructing the stored waveform for display. Typically, many samples per cycle of an input signal are taken so that a reasonable facsimile of the input waveform may later be constructed. If the waveform is reproduced as a dot display, a minimum of about 25 samples per cycle are generally required to produce a recognizable sine wave dot display. If a vector generator is utilized to essentially connect the dots, a minimum of about 10 samples per cycle are needed to provide a displayable waveform having no appreciable distortion. Thus the usable bandwidth of a digital oscilloscope is limited by the sample density per cycle of input signal.

Expensive and sophisticated digital oscilloscopes employ high-speed sampling and analog-to-digital converter systems coupled with memory devices capable of receiving the waveform data; however, even for these oscilloscopes, the frequency of the input signal can reach a point where the sampling density is reduced to a point that an unintelligible display is produced.

SUMMARY OF THE INVENTION

According to the present invention, the apparent sampling density is increased by interpolating between stored waveform samples and providing additional samples at the interpolated values between the actual samples.

As the waveform data is clocked out of a memory for display, it is applied via a digital-to-analog converter to a transversal filter, such as one having a sin x/x impulse response. The transversal filter may be in the form of a tapped analog delay line having a predetermined number of tapped outputs each having a predetermined weighting coefficient. The weighted outputs are summed to provide the interpolated points, which are then multiplexed with the actual samples to provide twice the number of samples as those stored. The resulting sequence of actual and interpolated samples are then displayed in the conventional manner. By using a transversal filter having an impulse response of sin x/x, a displayed sinewave may be recognizable from the displayed dots even if sampled at about 2.5 times per cycle. For non-sinewave displays, the sampling density may be increased to the required number of samples with no errors introduced for stored waveforms which were originally sampled at a rate of twice the highest frequency contained in the frequency spectrum of the original input signal.

It is therefore one object of the invention to provide a display system for a digital oscilloscope which includes an interpolator for interpolating between stored waveform samples and providing additional apparent samples at the interpolated values between the actual samples.

It is another object of the invention to provide a digital oscilloscope having an increased apparent bandwidth.

It is a further object of the invention to provide a digital display system which increases the apparent sampling density to provide a distinguishable display of a low number of actual samples taken per cycle.

Other objects and advantages of the present invention will become apparent to those skilled in the art upon a reading of the detailed description when taken in conjunction with accompanying drawings.

DRAWINGS

FIG. 1 is a block diagram of the display portion of a digital oscilloscope in accordance with the present invention; and FIG. 2 is a schematic drawing of a transversal filter for use in the system of FIG. 1.

DETAILED DESCRIPTION OF THE INVENTION

Referring to FIG. 1, a block diagram of the display portion of a digital oscilloscope is shown in which a display clock 10 provides clock pulses at a predetermined rate to an address counter 14 to clock stored waveform digital data out of a memory 20. The waveform data is applied via a digital-to-analog converter (DAC) 22 to a transversal filter 24 having an impulse response of sin x/x. The transversal filter may take the form shown in FIG. 2, wherein the actual waveform data in analog values is applied to a tapped analog delay device 30 having a predetermined number of tapped outputs. A device having eight tapped outputs is depicted for purposes of explanation; however, the actual device implemented and tested was a Reticon tapped analog delay device having 32 tapped outputs. The wavefrom data is shifted along the channel under control of the display clock. Weighting amplifiers 32–46 are provided at the tapped outputs to weight the data in accordance with predetermined weighting coefficients K1 through K8. For proper operation of the filter, the weighting coefficients should be chosen such that $$\sum_{N=1}^{8} K_N = 1.$$

In addition, the weighting coefficients of the transversal filter 24 were chosen such that filter passed all expected frequencies of the waveform signal. The tapped and weighted outputs are then summed by a summing device 50 to provide interpolated analog data. The actual data is picked off half way down the delay channel, which in this case is the fourth tap. In other words, eight analog data samples are weighted and averaged to provide additional samples which are multiplexed by a multiplexer 52 to provide a sequence of actual data and interpolated data.

The actual data with the interpolated data inserted therebetween may be routed directly to the vertical deflection plates of an associated cathoderay tube to provide a dot display having twice the dot density of the actual stored data or, the analog data may be applied to a vector generator 62 to reconstruct an analog waveform to be applied to be applied to the vertical deflection plates.

The count signal is applied to a horizontal DAC 66 to generate a sweep driving signal, which in turn is applied to a ramp generator 70, which generates a linear ramp signal to be applied to the horizontal deflection plates of the associated cathode-ray tube. The linear ramp allows the interpolated data to be displayed at the proper time position on the horizontal sweep.

While we have shown and described one embodiment of our invention, it will occur to those skilled in the art that many changes and modifications may be made without departing from the scope and spirit of the invention. For example, the transversal filter 24 may be implemented as a digital filter ahead of the DAC or in software or firmware form in accordance with conventional techniques.

What is claimed as being new is:

1. A waveform display system for a digital oscilloscope comprising:

a waveform memory containing digital data representative of amplitude values sampled from a waveform;

means for clocking said digital data out of said memory in a predetermined sequence;

means for converting said digital data to analog data representative of the amplitude of actual waveform samples;

transversal filter means for interpolating between respective adjacent actual analog data and producing interpolated analog data; and means for multiplexing said actual data and said interpolated data to provide a sequence of actual data with interpolated data inserted therebetween for display.

2. A system in accordance with claim 1 wherein said transversal filter means comprises a transversal filter having an impulse reponse of sin x/x.

3. A system in accordance with claim 1 wherein said transversal filter means includes a tapped analog delay device consisting of a delay channel having a predetermined number of tapped outputs, and means for weighting and summing said tapped outputs to provide interpolated data.

4. A system in accordance with claim 3 wherein said actual data to be multiplexed is picked off the tapped analog delay device at substantially the half way point of said delay channel.

* * * * *